(12) United States Patent
Glodde et al.

(10) Patent No.: US 10,345,702 B2
(45) Date of Patent: Jul. 9, 2019

(54) POLYMER BRUSHES FOR EXTREME ULTRAVIOLET PHOTOLITHOGRAPHY

(71) Applicant: International Business Machines Corporation, Armonk, NY (US)

(72) Inventors: Martin Glodde, Pine Brook, NJ (US); Dario L. Goldfarb, Dobbs Ferry, NY (US); Ankit Vora, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/686,045

(22) Filed: Aug. 24, 2017

(65) Prior Publication Data

US 2019/0064667 A1    Feb. 28, 2019

(51) Int. Cl.
| | |
|---|---|
| *C08G 83/00* | (2006.01) |
| *G03F 7/20* | (2006.01) |
| *G03F 7/11* | (2006.01) |
| *G03F 7/16* | (2006.01) |

(Continued)

(52) U.S. Cl.
CPC ............ *G03F 7/11* (2013.01); *C08G 83/00* (2013.01); *G03F 7/16* (2013.01); *G03F 7/2004* (2013.01); *G03F 7/2006* (2013.01); *G03F 7/30* (2013.01); *H01L 25/065* (2013.01)

(58) Field of Classification Search
CPC . G03F 7/11; G03F 7/16; G03F 7/2004; G03F 7/2006; G03F 7/30; C08G 83/00; H01L 25/065
See application file for complete search history.

(56) References Cited

U.S. PATENT DOCUMENTS

| | | | |
|---|---|---|---|
| 6,103,456 | A  | 8/2000  | Tobben et al. |
| 6,764,949 | B2 | 7/2004  | Bonser et al. |
| 7,115,534 | B2 | 10/2006 | Nguyen et al. |

(Continued)

FOREIGN PATENT DOCUMENTS

| | | |
|---|---|---|
| EP | 2707469 A1 | 3/2014 |
| EP | 2335917 B1 | 4/2014 |

OTHER PUBLICATIONS

Seshadri et al., "Photoresist Patterning on Silicon Nitride," U.S. Appl. No. 15/719,608, filed Sep. 29, 2017.

(Continued)

*Primary Examiner* — Timor Karimy
(74) *Attorney, Agent, or Firm* — Kelsey M. Skodje

(57) ABSTRACT

A polymer brush with a plurality of repeat units wherein some portions of the repeat units have one or more grafting groups and some portions have one or more interface tuning groups is disclosed. The grafting groups are selected based on the identity of an inorganic substrate, and the interface tuning groups are selected based on the identity of a photoresist that will interact with the groups. A process of lithographic patterning and an electronic device comprising at least one integrated circuit formed by the process of lithographic patterning are disclosed as well. The process comprises providing an inorganic substrate, depositing the disclosed polymer brush onto the inorganic substrate, and depositing a photoresist onto the polymer brush. The process further comprises masking the photoresist with a photomask having a pattern, and applying energy to the masked photoresist to form an etch mask. The inorganic substrate is then etched.

9 Claims, 6 Drawing Sheets

(51) Int. Cl.
*G03F 7/30* (2006.01)
*H01L 25/065* (2006.01)

(56) References Cited

U.S. PATENT DOCUMENTS

| | | |
|---|---|---|
| 8,093,177 B2 | 1/2012 | Hamers et al. |
| 8,124,485 B1 | 2/2012 | Goldfarb et al. |
| 8,143,571 B1 | 3/2012 | Dyer et al. |
| 8,294,139 B2 | 10/2012 | Marsh et al. |
| 8,728,714 B2 | 5/2014 | Millward |
| 8,828,871 B2 | 9/2014 | Zhou et al. |
| 8,901,741 B2 | 12/2014 | Colburn et al. |
| 9,171,720 B2 | 10/2015 | Wang et al. |
| 9,293,328 B2 | 3/2016 | Millward |
| 9,389,511 B2 * | 7/2016 | Schwartz ............... G03F 7/16 |
| 2008/0257015 A1 * | 10/2008 | Lukehart ............... B82Y 15/00 73/31.05 |
| 2011/0223390 A1 | 9/2011 | Hanawa et al. |
| 2014/0335455 A1 | 11/2014 | Trefonas, III et al. |
| 2015/0005458 A1 | 1/2015 | Yoshida |
| 2016/0049559 A1 | 2/2016 | Li et al. |
| 2017/0044327 A1 | 2/2017 | Li et al. |

OTHER PUBLICATIONS

Ciampi et al., "Functionalization of Acetylene-Terminated Monolayers on Si(100) Surfaces: A Click Chemistry Approach," Langmuir, 2007, vol. 23, No. 18, pp. 9320-9329. DOI: 10.1021/la701035g.

Debenedetti et al., "Functionalization of oxide-free silicon surfaces," Journal of Vacuum Science & Technology A: Vacuum, Surfaces, and Films, vol. 31, No. 5, Sep./Oct. 2013, pp. 050826-1-050826-18. DOI: 10.1116/1.4819406.

Edwards et al., "Precise Control over Molecular Dimensions of Block-Copolymer Domains Using the Interfacial Energy of Chemically Nanopatterned Substrates," Advanced Materials, 2004, vol. 16, No. 15, pp. 1315-1319. DOI: 10.1002/adma.200400763.

Hanisch et al., "Phosphonic Acid-Functionalized Diblock Copolymer Nano-Objects via Polymerization-Induced Self-Assembly: Synthesis, Characterization, and Occlusion into Calcite Crystals," Macromolecules, 2016, 49, pp. 192-204. DOI: 10.1021/acs.macromol.5b02212.

Mansky et al., "Controlling Polymer-Surface Interactions with Random Copolymers Brushes," Science, Mar. 7, 1997, vol. 275, Issue 5305, pp. 1458-1460. DOI: 10.1126/science.275.5305.1458.

Van Den Brand et al., "Improving the adhesion between epoxy coatings and aluminium substrates," Progress in Organic Coatings, Dec. 2004, vol. 51, Issue 4, pp. 339-350. DOI: 10.1016/j.porgcoat.2004.08.005.

Goldfarb et al., "Pattern collapse mitigation strategies for EUV lithography," Proc. of SPIE 8322, Extreme Ultraviolet (EUV) Lithography III, 832205, Mar. 2012, pp. 1-13. DOI: 10.1117.12.915431.

Arceo De La Pena et al., Tunable TiOxNy Hardmask for MultiLayer Patterning, U.S. Appl. No. 15/404,375, filed Jan. 12, 2017.

Felix et al., "Method to Increase the Lithographic Process Window of Extreme Ultra Violet Negative Tone Development Resists," U.S. Appl. No. 15/429,871, filed Feb. 10, 2017.

Desilva et al., "Approach to Lowering Extreme Ultraviolet Exposure Dose for Inorganic Hardmasks for Extreme Ultraviolet Patterning," U.S. Appl. No. 15/406,327, filed Jan. 13, 2017.

Arceo De La Pena et al., "Application of Titanium-Oxide as a Patterning Hardmask," U.S. Appl. No. 15/397,966, filed Jan. 4, 2017.

Glodde et al., "Method to Improve Adhesion of Photoresist on Silicon Substrate for Extreme Ultraviolet and Electron Beam Lithography," U.S. Appl. No. 15/433,619, filed Feb. 15, 2017.

Liu et al., "Integration of block copolymer directed assembly with 193 immersion lithography," Journal of Vacuum Science & Technology B, Nanotechnology and Microelectronics: Materials, Processing, Measurement, and Phenomena, vol. 28, Issue 6, Nov./Dec. 2010, pp. C6B30-C6B34.

Park et al., "Block copolymer multiple patterning integrated with conventional ArF lithography," Soft Matter, 2010, 6, pp. 120-125. DOI: 10.1039/B913853.

International Search Report and Written Opinion for International Application No. PCT/IB2018/056023 dated Dec. 12, 2018.

* cited by examiner

400

404

408

412

416

POLYMER BRUSHES FOR EXTREME ULTRAVIOLET PHOTOLITHOGRAPHY

BACKGROUND

The present disclosure relates to lithographic materials for extreme ultraviolet (EUV) lithography and, more specifically, polymer brushes for mediating interfacial interactions between photoresists and inorganic substrates.

Extreme ultraviolet (EUV) lithography is a lithographic technique used in semiconductor fabrication that employs extreme ultraviolet light to transfer a pattern from a photomask to a resist. The pattern is then transferred from the resist to a hardmask through etching, and from the hardmask to a semiconductor material through additional etching. EUV light has wavelengths of approximately 124-10 nm, which are close to the X-ray region. The short wavelengths provided by EUV light allow for high resolution patterning in semiconductor fabrication.

SUMMARY

Various embodiments are directed to a polymer brush comprising a plurality of repeat units, portions of the plurality of repeat units having one or more grafting groups, one or more interface tuning groups, and optionally one or more cleavable groups. The grafting groups are selected based on the identity of an inorganic substrate, such as an inorganic hardmask, to which the groups will bind. Examples of grafting groups can include alkynes, primary hydroxyls, secondary hydroxyls, acrylic acids, epoxies, alkenes, phosphonic acids, propargyls, phosphonic esters, amines, carboxylic acids, and alkoxysilanes. Examples of inorganic hardmask materials can include silicon, titanium nitride, titanium oxides, titanium oxynitrides, tantalum nitride, hafnium oxides, niobium nitride, lanthanum oxide, silicon oxides, silicon oxynitrides, zirconium oxides, and tin oxides. The interface tuning groups are selected based on the identity of a photoresist that will interact with the groups. Examples of tuning groups can include acidic groups, phenyl groups, methoxy groups, ethylene groups, hydrogen atoms, methyl groups, and trifluoromethyl groups.

Further embodiments are directed to a process of lithographic patterning. The process can comprise providing an inorganic substrate, such as an ultrathin inorganic hardmask, depositing a polymer brush onto the inorganic substrate, and depositing a photoresist onto the polymer brush. The polymer brush can comprise a plurality of repeat units, portions of the plurality of repeat units having one or more grafting groups, one or more interface tuning groups, and optionally one or more cleavable groups. Examples of photoresists can include acrylic photoresist, phenolic photoresists, and hybrid photoresists. The process can further comprise masking the photoresist with a photomask having a pattern. Energy, such as extreme ultraviolet light, can be applied to the masked photoresist. This energy can come from a laser-driven tin (Sn) plasma. An etch mask can then be formed by developing the photoresist. The pattern is then transferred to the inorganic substrate by etching the portions of the inorganic substrate that are exposed by the etch mask.

Additional embodiments are directed to an electronic device comprising at least one integrated circuit chip prepared in an extreme ultraviolet lithographic patterning process. The electronic device can further comprise at least one additional integrated circuit chip. The extreme ultraviolet lithographic patterning process can comprise providing an inorganic substrate, depositing a polymer brush onto the inorganic substrate, and depositing a photoresist onto the polymer brush. The polymer brush can comprise a plurality of repeat units, portions of the plurality of repeat units having one or more grafting groups, one or more interface tuning groups, and optionally one or more cleavable groups. The process can further comprise masking the photoresist with a photomask having a pattern. Extreme ultraviolet light can be applied to the masked photoresist. An etch mask can then be formed by developing the photoresist. The pattern can then be transferred to the inorganic substrate by etching the portions of the inorganic substrate that are exposed by the etch mask.

DETAILED DESCRIPTION

Figure 1:
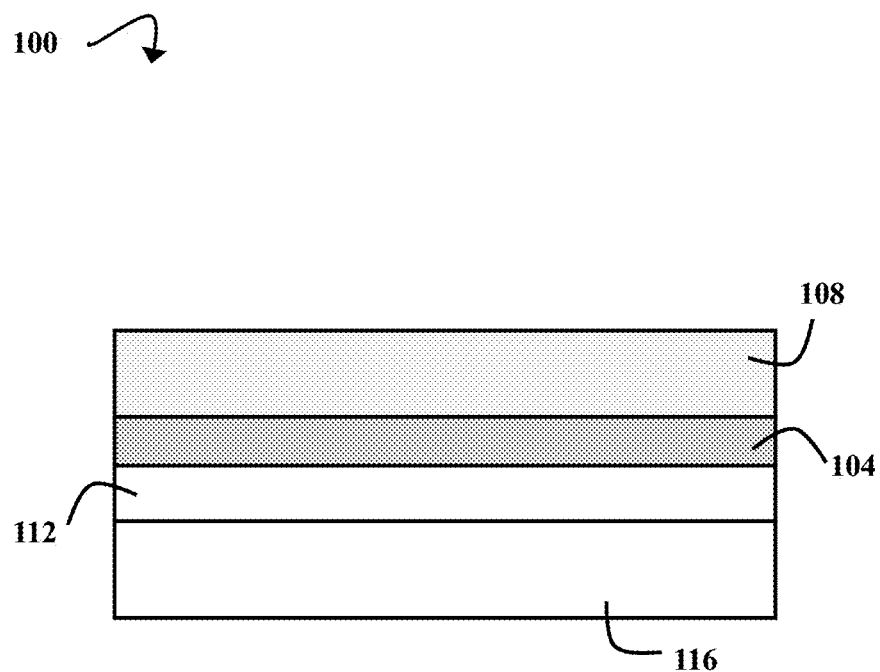
FIG. 1 is a schematic diagram illustrating a stack of layers for extreme ultraviolet (EUV) lithographic patterning, according to some embodiments of the present disclosure

Photolithography is a technique commonly used in semiconductor fabrication to etch integrated circuit patterns onto semiconducting wafers. Photolithographic patterning involves coating a base material with a photosensitive resist material, which is referred to herein as a photoresist. The photoresist is selectively masked by a photomask that is designed with the pattern to be etched onto the semiconductor. An energy source, such as electromagnetic radiation or an electron beam, is applied. The unmasked sections of the photoresist are exposed to the energy source. When the photoresist is exposed to the energy source, a chemical reaction occurs so that selected sections of the photoresist are dissolvable in a developer, and therefore removable during a development stage in the lithographic process. Removing the dissolvable sections during the development stage creates the patterned photoresist. The patterned photoresist can also be referred to as an "etch mask." The pattern can be transferred from the etch mask to semiconductor or other substrate materials during subsequent etching steps. In these step, the parts of the substrate that are not covered by the etch mask are etched.

The locations of the dissolvable sections of the photoresist depend upon the selection of photoresist material and developer. The developer is a solvent in which the photoresist is immersed after exposure to the energy source. Immersion in the developer allows the dissolvable sections of the photoresist to be removed. Removal can be aided by rinsing with a solvent after development. Photoresists can be categorized as either positive photoresists or negative photoresists. When a positive photoresist is exposed to negative tone development, the sections of the photoresist that were not exposed to the energy source (i.e., the masked sections) are soluble in the developer. However, when a positive photoresist is exposed to positive tone development, the sections that were exposed to the energy source (i.e., the unmasked sections) are soluble in the developer.

Traditionally, the electromagnetic radiation emitted by the energy source used in the photolithographic process has had wavelengths in the region of 436 nm (blue light), 365 nm (near ultraviolet (UV)), or 248-193 nm (deep UV). Feature sizes in a pattern to be printed on a semiconductor are, in part, dependent on the wavelength of radiation used. That is, the smallest printable features are limited by the shortest wavelength produced by the energy source. As technology progresses to require smaller devices with a greater number of integrated circuits, shorter wavelengths become more desirable. Therefore, various types of next-generation lithography techniques that can provide these shorter wavelengths are being explored and developed.

One type of next-generation lithography is a photolithographic technique called extreme ultraviolet (EUV) lithography. EUV lithography employs light in the 124-10 nm (EUV) region. For high-resolution patterning in semiconductor fabrication, an EUV wavelength of about 13.5-10 nm, generated by a laser-driven tin (Sn) plasma source, is often used. This high-resolution patterning is generally carried out with positive photoresists that are exposed to positive tone development, but positive photoresists and negative tone development can be used as well. However, while EUV lithography allows for the production of smaller semiconductor chips, there are challenges associated with its use.

One of these challenges arises in the adhesion of the photoresist to the underlying base material, or substrate (e.g., an inorganic hardmask (HM), metal, semiconductor material, etc.). For example, when using small-dimensioned patterns, capillary forces can be greater than the adhesive interactions between the photoresist and the substrate. When the photoresist does not adhere properly to the substrate, pattern collapse can occur. Additionally, if residue from the photoresist is left behind after development and rinsing, the pattern can be disrupted. Thus, techniques for attaining stable adhesion and absence of residue between the photoresist and the underlying substrate without necessitating additional expensive and/or time-consuming processing steps are of interest.

Polymer brushes designed to mediate interfacial interactions between a photoresist and an inorganic substrate are disclosed herein. This mediation results in improved adhesion in some embodiments. A polymer brush is a polymer macromolecule having repeat units with at least one functional group that can be grafted (i.e., covalently bonded) to a substrate. The polymer brushes disclosed herein are grafted to the surface of the inorganic substrate, and mediate its interaction with the photoresist. The polymer brushes can be synthesized by the polymerization of a variety of monomers. The identity of the monomers determines the properties and reactivity of the polymer brush. The monomers can have functional groups for grafting to a variety of inorganic materials, functional groups that allow the polymer to be cleaved from the grafting group, functional groups that interact with the photoresist, functional groups that interact with solvents and developers, functional groups that harvest photons, etc. Further, the polymer brushes disclosed herein can be formulated in a spin-castable solvent, and therefore do not introduce significant processing complexity or expense.

FIG. 1 is a schematic diagram 100 illustrating a stack of layers 104, 108, 112, and 116 for EUV lithographic patterning, according to some embodiments of the present disclosure. The stack includes a polymer brush 104 between a photoresist 108 and an inorganic hardmask 112 that is on a semiconductor wafer 116. While the polymer brush 104 is illustrated as being bonded to an inorganic hardmask 112 over a semiconductor wafer 116, additional layers may be present in some embodiments. For example, an organic underlayer (e.g., carbon or a polymer) and/or a dielectric layer (e.g., silicon dioxide or silicon oxynitride) can be included. Processes of forming the layers 104, 108, 112, and 116 are discussed in greater detail with respect to FIG. 2.

Examples of photoresist layers 108 can include phenolic, acrylic, or hybrid (phenolic-acrylic) chemically amplified photoresists. Examples of phenolic photoresists can include polyoxybenzylmethylenglycolanhydride (Bakelite), cresol formaldehyde novolac resins, copolymers of polyhydroxystyrene modified with a ketal-based protecting group or a tert-butyloxycarbonyl protecting group, etc. Examples of acrylic photoresists can include poly(methyl methacrylate) (PMMA), polyacrylate, norbornane lactone methacrylate (NLM)/methyl adamantane methacrylate (MAdMA) copolymers, etc. Hybrid photoresists are polymers that combine phenolic and acrylic monomers such as polyhydroxystyrene/MAdMA copolymers.

In some embodiments, the photoresist 108 is prepared by dissolving the phenolic, acrylic, or hybrid monomers in an organic solvent (e.g., propylene glycol monomethyl ether acetate or cyclohexanone), and adding a suitable photoacid generator (e.g., triphenylsulfonium perfluorobutanesulfonate) and base quencher (e.g., tetrabutylammonium lactate). However, commercially available or pre-prepared photoresists can also be used. In some embodiments, the thickness of the photoresist ranges from approximately 30 nm to 50 nm, though it can range from approximately 1 nm to 500 μm.

The photoresist 108 adheres to the polymer brush 104, which is grafted to the inorganic hardmask 112. The polymer brush has repeat units that are determined by the identity of the monomers polymerized. The repeat units are functionalized with groups that affect the properties and interactions of the polymer brush 104, such as grafting, interface interactions with the photoresist, and cleavability. Examples of polymer brushes can include vinyl polymers, epoxy polymers, polyester polymers, polyurethane polymers, polyamide polymers, polycarbonate polymers, polyurea polymers, polyether polymers, polyimide polymers, etc. In some embodiments, the average molecular weight of the polymer brushes is in a range of 2,000 to 10,000 Da (g/mol). However, the average molecular weights of the polymer brushes can, in some embodiments, be within a range of 400 to 10,000,000 Da.

The polymer brush 104 includes repeat units with at least one functional group capable of grafting to the inorganic hardmask 112 in one or more locations. The functional group that binds to the inorganic hardmask 112 is referred to herein as a "grafting group." Examples of grafting groups can include alkynes, primary hydroxyls, secondary hydroxyls, acrylic acids, epoxies, alkenes, phosphonic acids, propargyls, phosphonic esters, amines, carboxylic acids, alkoxysilanes, etc. The selection of grafting group is based, at least in part, on the reactivity between the grafting group and the underlying substrate. This is discussed in greater detail with respect to FIG. 2.

The polymer brush 104 also includes repeat units with least one tunable functional group that interacts with the photoresist 108. This functional group is referred to herein as an "interface tuning group." Tuning the functional group refers to selecting the functional group based on its properties (e.g., charge, acidity, size, polarity, etc.). Examples of this interaction can include promoting photoresist adhesion, increasing photon harvesting, improving photoresist performance, etc. The interface tuning groups can also affect the surface energy or contact angle with water of the polymer brush 104. Examples of interface tuning groups can include acidic groups (e.g., phenol, sulfonic acid, fluorosulfonic acid, carboxylic acids, acrylic acids, etc.), phenyl groups, methoxy groups, ethylene groups, hydrogen atoms, methyl groups, trifluoromethyl groups, etc.

Additionally, the polymer brush 104 can optionally include repeat units having functional groups capable of being cleaved in a later reaction. This functional group is referred to herein as a "cleavable group." In some embodiments, the cleavable group is a tertiary ester. Additional examples of cleavable groups can include primary and secondary esters, sulfate esters, phosphate esters, etc. Methods of cleaving the polymer brush 104 can include applying heat, acid, photons, etc. For example, a methyl ester cleavable group can be cleaved when exposed to 172 nm light and a developer solution. In addition, cleaving can be accomplished with a combination of two or more cleaving methods. Cleaving the polymer brush 104 from the surface of an inorganic hardmask 112 enables reworking or wet etching of the hardmask 112. Additionally, cleaving can reduce the amount of residue left behind by the photoresist 108, thereby preventing pattern disruption or scumming caused by the residue.

The inorganic hardmask (HM) 112 to which the polymer brush 104 is grafted can be composed of various materials. In some embodiments, the inorganic HM 112 is a transition metal oxide or lanthanide oxide. The inorganic HM 112 can also be a transition metal nitride or lanthanide nitride. Further, the inorganic HM 112 can be a transition metal oxynitride or lanthanide oxynitride. Examples of these inorganic HM 112 materials can include silicon, titanium nitride (TiN), titanium oxides ($TiO_x$), titanium oxynitrides ($TiO_xN_y$), tantalum nitride (TaN), hafnium oxides ($HfO_x$), niobium nitride (NbN), lanthanum oxide ($La_2O_3$), low temperature oxides (LTOs), silicon oxides ($SiO_x$), silicon oxynitrides ($SiO_xN_y$), zirconium oxides ($ZrO_x$), tin oxides ($SnO_x$), etc. In the preceding chemical formulas, "x" and "y" represent the number of oxygen or nitrogen atoms (e.g., 1, 2, or 3 atoms), respectively. In some embodiments, the inorganic HM 112 is an ultrathin hardmask (i.e., an inorganic hardmask with a thickness of less than or equal to approximately 5 nm).

A pattern created on the photoresist is transferred onto the inorganic hardmask 112, and then onto the semiconductor wafer 116. This transfer involves etching the sections of the substrate that were removed during development of the photoresist. The transfer can optionally involve steps in which the pattern is transferred onto layers between the inorganic HM 112 and semiconductor wafer 116 first. This is discussed in greater detail above. Examples of semiconductor wafer 116 materials can include silicon (Si), germanium (Ge), silicon-germanium (Si—Ge), graphene, organic semiconductors, silicon carbide (SiC), gallium arsenide (GaAs), gallium nitride (GaN), indium gallium arsenide (InGaAs), etc. The silicon can be amorphous silicon (aSi), crystalline silicon (cSi), or polycrystalline silicon (poly-Si).

Figure 2:
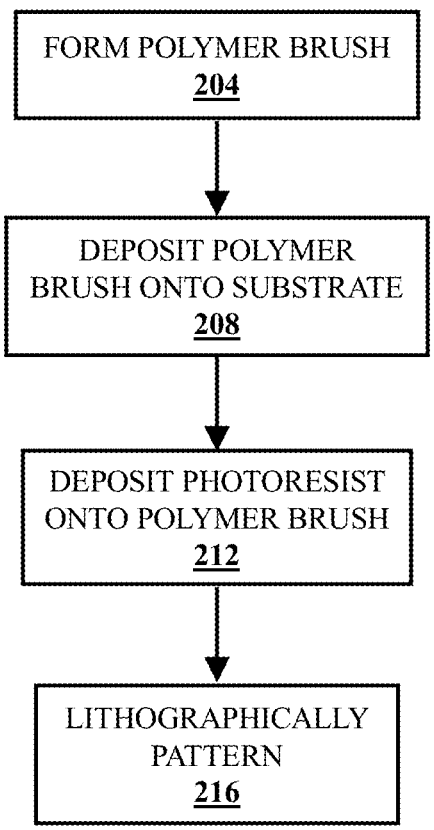
FIG. 2 is a flow diagram illustrating a process of forming a polymer brush that mediates adhesion of a photoresist to an inorganic hardmask, according to some embodiments of the present disclosure.

FIG. 2 is a flow diagram illustrating a process 200 of forming a polymer brush 104 that mediates adhesion of a photoresist 108 to an inorganic hardmask 112, according to some embodiments of the present disclosure. The polymer brush 104 is formed by the polymerization of one or more types of monomer. This is illustrated at step 204. Examples of monomers that can be polymerized in the synthesis of the polymer brush 104 can include acrylate esters, acryl amide, methacrylate esters, methacryl amides, vinyl esters, vinyl ethers, olefins, etc. The monomers can be substituted and/or unsubstituted. In some embodiments, the polymer brush 104 is formed by polymerization of a diol compound and a diisocyanate, condensation polymerization of a diol compound or a diamine compound and a dicarboxylic acid, ring-opening polymerization of a lactone or a lactam, condensation polymerization of an aminocarboxylic acid, etc.

The monomers that will form the polymer brush 104 are selected based on the desired properties of the resulting polymer brush 104. Monomers that include at least one grafting group, at least one interface tuning group, and optionally at least one cleavable group are polymerized to form the polymer brush. In some embodiments, each of these functional groups are on different types of monomer. However, monomers that include two or more of the functional groups can also be used. For example, one type of monomer could include two grafting groups or one grafting group and one interface tuning group. Additionally, the functional groups can form during the polymerization process or in subsequent reactions, rather than being initially bound to the monomers.

The polymer brush 104 can be made from the polymerization of one type of monomer, or from the polymerization of two or more types of monomer. For example, a polymer brush 104 could be made from a type of monomer that has both a grafting group and an interface tuning group. The polymer brush 104 could also be made of one type of monomer that has only a grafting group and one type of monomer that has only an interface tuning group. Polymerizing one type of monomer results in a homopolymer (i.e., a polymer having one type of repeat unit), while polymerizing two or more types of monomer results in a copolymer (i.e., a polymer having two or more types of repeat unit). Examples of the structures and syntheses of polymer brushes are discussed in greater detail with respect to FIGS. 3, 4, and 5A.

In some embodiments, the choice of grafting group is based upon the inorganic hardmask (HM) 112 to which it will form a stable bond. For example, phosphonic acid grafting groups will bind to metal oxides (e.g., $TiO_x$, $La_2O_3$, $HfO_x$, $ZrO_x$, $SnO_x$, etc.), and terminal alkyne or alkene grafting groups will bind to silicon surfaces (e.g., aSi, cSi, poly-Si, silicon hydrides, etc.). Additional examples of grafting groups that bind to metal oxides can include phosphonic esters, hydroxyls, alkoxysilanes, etc. Hydroxyl grafting groups are often used when the inorganic HM 112 material is a silicon oxide ($SiO_x$) or silicon oxynitride ($SiO_xN_y$). Further, acidic grafting groups (e.g., phosphonic acid, carboxylic acid, acrylic acid, etc.) will bind to SiN surfaces, and alkene grafting groups will bind to metal oxides such as $TiO_2$, ZnO, $ZrO_2$, $SnO_2$.

The polymer brush 104 is deposited onto the inorganic HM 112 substrate. This is illustrated at step 208. A mixture containing the polymer brush 104 in an organic solvent is prepared. In some embodiments, the polymer brush 104 is prepared in this organic solvent. Examples of organic solvents that can be used can include propylene glycol monomethyl ether acetate (PGMEA), propylene glycol methyl ether (PGME), 4-methyl-2-pentanol (4M2P), cyclohexanone (CHX), ethyl 3-epoxypropionate (EEP), n-butyl acetate (nBA), etc. A layer of the solvent/polymer mixture is deposited onto the substrate by spin casting or spin coating. The coated substrate is then baked at a temperature ranging from approximately 18° C. to 350° C. in order to remove the solvent, and to promote the bonding of the grafting groups to the substrate surface. Any non-grafted portions of the polymer brush can be removed by rinsing with an organic solvent (e.g., PGMEA, PGME, 4M2P, CHX, EEP, nBA, etc.).

A photoresist 108 is then deposited onto the grafted polymer brush 104. This is illustrated at step 212. A variety of coating processes can be used to apply the photoresist 108. Examples of these coating processes can include spin coating, spray coating, dip coating, knife edge coating, printing approaches (e.g., ink jet or screen printing), spin casting, etc. The application can take place in a single coating step or multiple coating steps. Using multiple coating steps can provide greater control over the coating process. For example, a series of spin coatings can be used to provide a desired thickness, which can range from a few nanometers to a few microns. After the photoresist is coated onto the polymer brush 104 and substrate 112, further heating and/or solvent evaporation steps can be carried out to harden the photoresist layer in some embodiments.

Following the formation of the photoresist layer 108, lithographic patterning with extreme ultraviolet (EUV) light is carried out. This is illustrated at step 216. A variety of EUV light sources can be used. EUV light sources for lithography generally have a high average power (e.g., 100 W or higher) at 2% bandwidth with a central wavelength of 13.5 nm. For example, a laser-driven tin (Sn) plasma with a high power drive laser having a wavelength less than approximately 1 µm can be employed. In some embodiments, the drive laser is a pulsed laser. However, the drive laser can also be a solid-state laser, gas-discharge laser, or excimer laser. Examples of drive laser sources can include neodymium-doped yttrium aluminum garnet (Nd:YAG), erbium-doped yttrium aluminum garnet (Er:YAG), ytterbium-doped yttrium aluminum garnet (Yb:YAG), titanium sapphire (Ti:Sapphire), neodymium vanadate (Nd:Vanadate), etc. It should also be noted that in some embodiments the patterning can be carried out with electron beam (e-beam) lithography or immersion photolithography, rather than EUV lithography.

A photomask with the desired pattern is used to partially mask the photoresist before exposure to the energy source. Exposing the photoresist to EUV light causes a chemical reaction to occur in the unmasked sections of the photoresist. When a positive photoresist with negative tone development is used, the chemical reaction changes the unmasked sections from soluble to insoluble in the developer. However, when a positive photoresist with positive tone development is used, the chemical reaction changes the unmasked sections from insoluble to soluble in the developer.

In order to promote the desired solubility switch, the process can optionally continue with a hard bake (i.e., a post-exposure bake (PEB)). In some embodiments, the coating material is heated at temperatures ranging from about 45° C. to 150° C. However, the coating material can also be heated at temperatures ranging from about 50° C. to 130° C. or about 60° C. to 110° C. In some embodiments, the PEB is performed for at least about 0.1 minute. However, the PEB can be performed from about 0.5 minutes to about 30 minutes or from about 0.75 minutes to about 10 minutes.

The soluble portions of the photoresist are removed by exposure to the developer, followed by rinsing. In some embodiments, the developer is n-butyl acetate or an aqueous solution of tetramethylammonium hydroxide (TMAH). However, a dilute aqueous solution of sodium carbonate ($Na_2CO_3$) or potassium carbonate ($K_2CO_3$) can be used as a developer as well. Further, developers based on aqueous solutions of buffered sodium hydroxide (NaOH), buffered potassium hydroxide (KOH), TMAH in water with added surfactants, mixtures of NaOH and KOH, etc. can be used. Examples of solutions or solvents for rinsing away soluble photoresist 108 material after treatment with the developer can include deionized water, water with added surfactants, mixtures of water with miscible alcohols, etc.

The polymer brush 104 can be left on the inorganic hardmask (HM) 112. However, if the polymer brush 104 has cleavable groups, it can be partially or completely removed from the substrate during or after patterning. Removing the polymer brush 104 is accomplished by applying reaction conditions that will disrupt bonds at the cleavable groups. Examples of reaction conditions that can cleave these groups can include acid, heat, photon radiation, etc. A combination of two or more of these conditions can also be used. The resulting cleaved polymer can then be rinsed away with an organic solvent.

Following the development of the photoresist 108, the pattern (i.e., the sections that were removed during development of the photoresist 108) is etched onto the inorganic HM 112. However, it should be noted that the methods described herein can also be applied to etching onto a silicon wafer or other substrate layers. Further, in some embodiments the inorganic HM 112 or other substrate is etched by reactive ion etching (RIE), though other examples of etching processes that can be used can include ion beam etching, plasma etching, laser ablation, etc.

Figure 3:
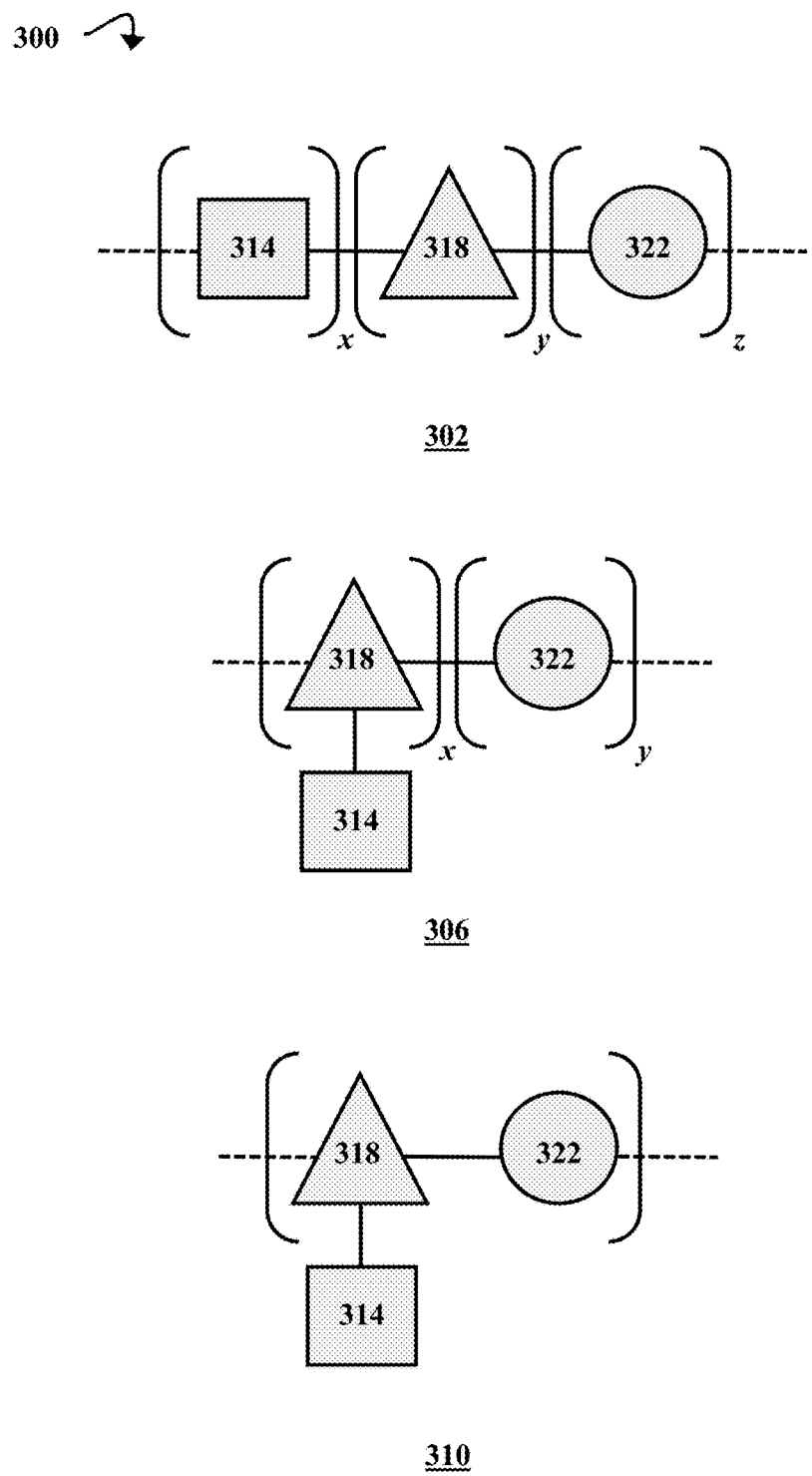
FIG. 3 is a diagrammatic representation of block structures of three examples of generic polymer brushes, according to some embodiments of the present disclosure.

FIG. 3 is a diagrammatic representation 300 of block structures 302, 306, and 310 of three examples of generic polymer brushes, according to some embodiments of the present disclosure. The generic polymer brushes represented by block structures 302, 306, and 310 each have some combination of repeat units with grafting groups 314, cleavable groups 318, and interface tuning groups 322. The functional groups 314, 318, and 322 are represented by a square, triangle, and circle, respectively. However, these shapes are for illustrative purposes only, and do not represent the actual approximate shapes of functional groups or monomers in the polymer brush. The molecular structures of examples of polymers with functional groups 314, 318, and 322 attached are discussed in greater detail with respect to FIG. 4.

The x, y, and z portions of the polymer chains in the polymer brush block structures 302, 306, and 310 represent portions of the polymer chains having different types of repeat unit (i.e., repeat units provided by different monomers and/or having different functional groups). The x portion of the first block structure 302 is a portion of the chain having repeat units with grafting groups 314, the y portion of the first block structure 302 is a portion of the chain having repeat units with cleavable groups 318, and the z portion of the first block structure 302 is a portion of the chain having repeat units with interface tuning groups 322.

The x portion of the second block structure 306 is a portion of the chain having repeat units with both grafting groups 314 and cleavable groups 318, and the y portion of the second block structure 306 is a portion of the chain having repeat units with interface tuning groups 322. The third block structure 310 represents an alternating copolymer having repeat units with grafting groups 314, cleavable groups 318, and interface tuning groups 322. In some embodiments, the polymer brushes disclosed herein have more than one type of each functional group 314, 318, and/or 322 in one repeat unit. For example, a polymer brush 104 could have both a phenol and a methoxy interface tuning group 322 in one repeat unit.

It should also be noted that other combinations of monomers and functional groups are possible. For example, a polymer brush 104 could have one repeat unit with both grafting 314 and interface tuning groups 322. Additionally, in some embodiments the polymer brushes 104 do not have cleavable groups 318. Further, polymer brushes 104 can have more than one of each chain portion. For example, a polymer brush represented by the block structure 302 could have, in addition to its x portion, other portions containing repeat units with grafting groups 314. A polymer brush 104 can also include portions having repeat units with functional groups that are not grafting groups 314, cleavable groups 318, or interface tuning groups 322.

The relative lengths of the polymer brush 104 chain portions (i.e., the number of repeat unit in the chain portion) can vary relative to one another. When the portion lengths are varied, properties of the polymer brush 104 are affected. For example, increasing the number of grafting groups 314 by lengthening the x portion relative to the y and z portions of the first block structure 302 can increase the density of binding locations for grafting of the polymer brush 104 to the inorganic HM 112. Additionally, increasing or decreasing the number of interface tuning groups 322 by lengthening the z portion relative to the x and y portions of the polymer brush represented by the first block structure 302 can alter the nature of the interactions between the polymer brush 104 and photoresist 108.

Further, the number of portions of a particular repeat unit can be increased or decreased. For example, rather than increasing the length of the x portion of the polymer brush represented by the first block structure 302, additional chain portions having repeat units with grafting groups 314 could be included to increase the density of binding locations. These chain portions could be x portions, or they could be portions of another repeat unit having the same or different grafting groups 314. The length and frequency of chain portions can be controlled using monomer choice and polymerization conditions.

Figure 4:
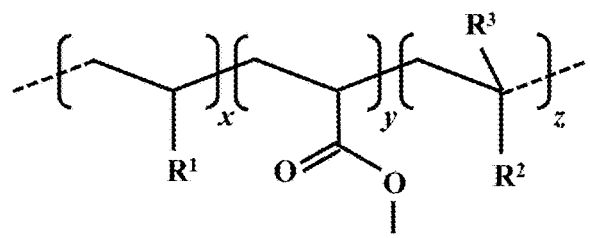
FIG. 4 is a diagrammatic representation of the molecular structures of four examples of polymer brushes, according to some embodiments of the present disclosure.
Figure 4:
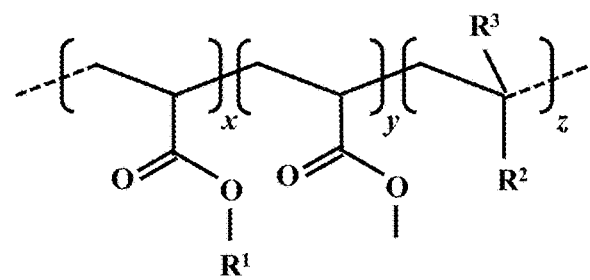
Figure 4:
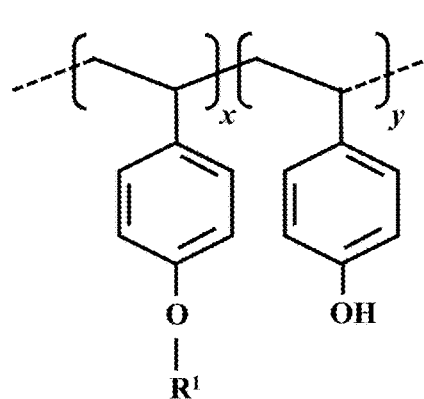
Figure 4:
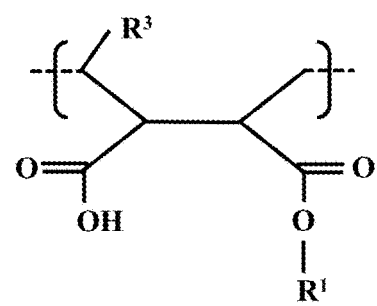

FIG. 4 is a diagrammatic representation 400 of the molecular structures of four examples of polymer brushes 404, 408, 412, and 416, according to some embodiments of the present disclosure. The x, y, and z portions of polymer brushes 404 and 408 correspond to the x, y, and z portions of the first polymer brush block structure 302 illustrated in FIG. 3. The $R^1$ groups in the x portions of polymer brushes 404 and 408 are substituents having at least one grafting group 314. The methyl ester group in the y portions of the polymer brushes 404 and 408 is a cleavable group 318. The $R^2$ groups in the z portions of polymer brushes 404 and 408 are acidic interface tuning groups 322, and the $R^3$ groups can be a hydrogen atom, a methyl group, or a trifluoromethyl group.

The x and y portions of polymer brush 412 correspond to the x and y portions of the second polymer brush block structure 306 illustrated in FIG. 3. However, unlike the x portion of the second block structure 306, the x portion of polymer brush 412 does not include a cleavable group 318. The x portion of polymer brush 412 has repeat units with $R^1$ grafting groups 314, and the y portion of polymer brush 412 has repeat units with phenol interface tuning groups 322. Polymer brush 416 is an alternating copolymer that corresponds to the third polymer brush block structure 310 illustrated in FIG. 3. The carboxylic acid groups and $R^3$ groups on polymer brush 416 act as interface tuning groups 322. Further, the $R^1$ group is a substituent with at least one grafting group 314, and the ester moiety is a cleavable group 318.

Figure 5A:
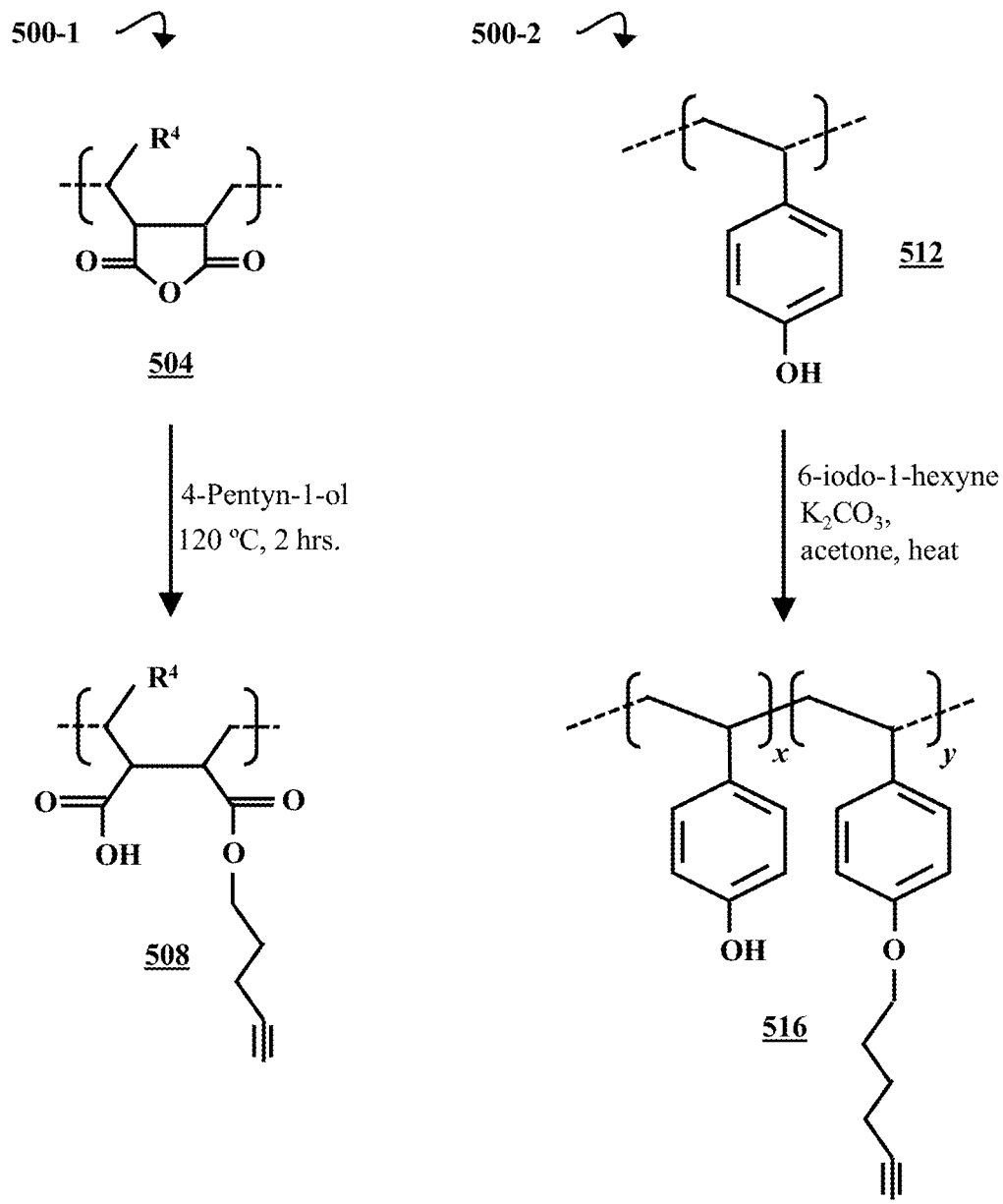
FIG. 5A is a chemical reaction diagram illustrating processes of forming two polymer brushes, according to some embodiments of the present disclosure.

FIG. 5A is a chemical reaction diagram 500 illustrating processes 500-1 and 500-2 of forming two example polymer brushes 508 and 516, according to some embodiments of the present disclosure. In these reactions, the polymer brushes 508 and 516 are formed by binding alkyne grafting groups 314 to pre-selected polymers. In the first of the two reactions 500-1, a poly(maleic anhydride) polymer 504 is a starting material for the polymer brush 508. This poly(maleic anhydride) polymer 504 has an $R^4$ group that acts as an interface tuning group on the resulting polymer brush. Examples of $R^4$ groups can include phenyl groups, methoxy groups, ethylene groups, etc. In process, 500-1, the poly(maleic anhydride) polymer 504 is combined with 4-pentyn-1-ol, which is an alcohol with a terminal alkyne moiety. The mixture is reacted at approximately 120° C. for approximately two hours. This anhydride ring-opening reaction produces a polymer brush 508 with an alkyne grafting group bound to an ester moiety.

In the second reaction 500-2, polyhydroxystyrene (PHOST) 512 is combined with 6-iodo-1-hexyne and potassium carbonate ($K_2CO_3$) in an acetone solution. The solution is heated to produce a PHOST-derived polymer brush 516 with phenol interface tuning groups 322 on the repeat units in its x portion and alkyne grafting groups 314 on the repeat units in its y portion. The x and y portions of the PHOST-derived polymer brush 516 can be any length and can alternate in portions of identical length or different lengths. Adjusting the stoichiometry of this reaction can vary the number of alkyne grafting groups.

Figure 5B:
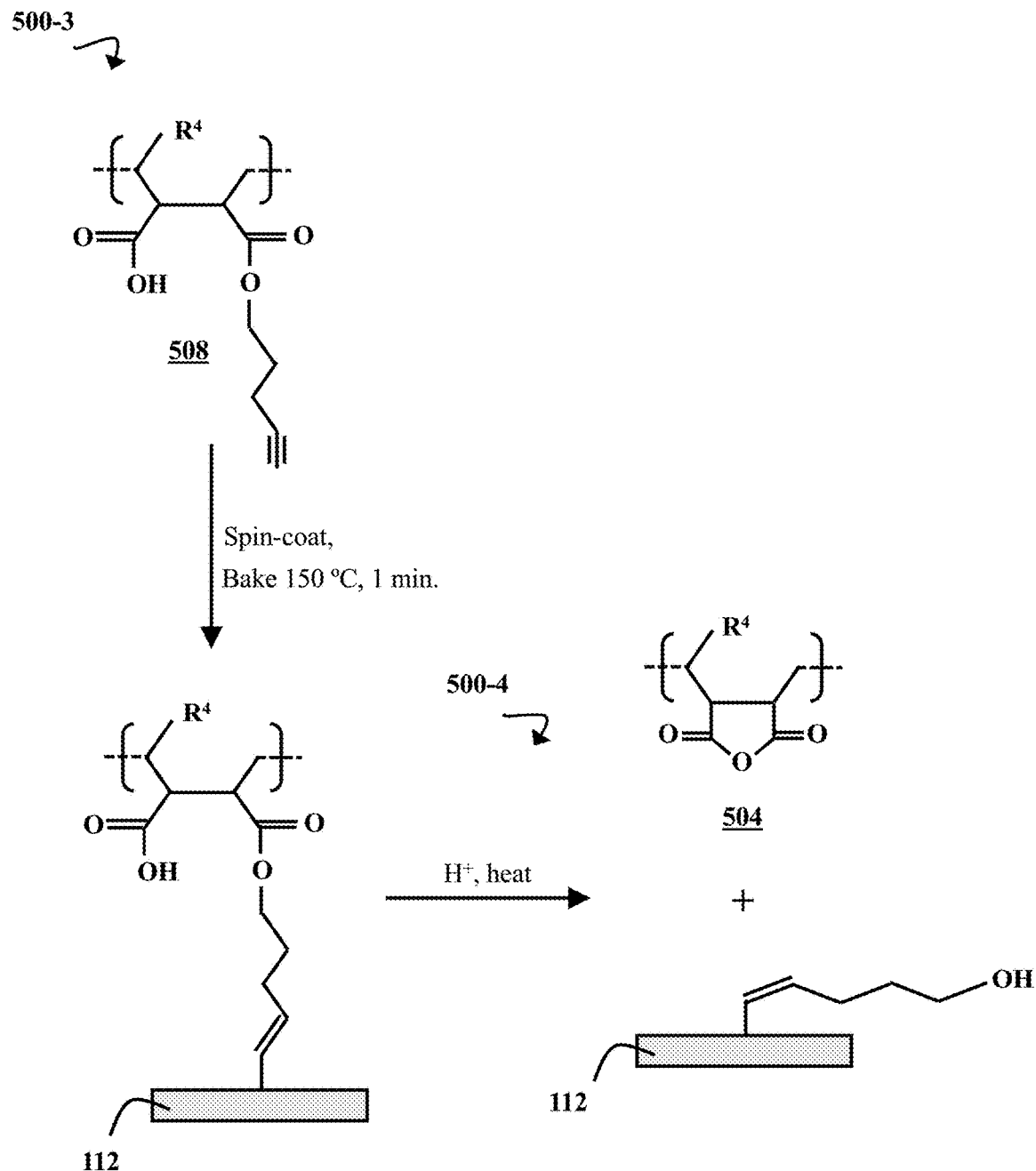
FIG. 5B is a chemical reaction diagram illustrating a process of grafting a polymer brush to an inorganic hardmask, and a process of cleaving the polymer brush from the inorganic hardmask, according to some embodiments of the present disclosure.

FIG. 5B is a chemical reaction diagram illustrating a process 500-3 of grafting a polymer brush 508 to an inorganic hardmask (HM) 112, and a process 500-4 of cleaving the polymer brush 508 from the inorganic HM 112, according to some embodiments of the present disclosure. In process 500-3, the polymer brush 508 is spin coated onto the inorganic HM 112, and subsequently baked for approximately 1 minute at approximately 150° C. The baking promotes the covalent bonding of the alkyne grafting groups 314 on the polymer brush 508 to the inorganic HM 112. Upon attaching the polymer brush 508, subsequent preparation steps can be carried out (e.g., photoresist application and lithographic patterning). In process 500-4, the polymer brush 508 is cleaved from the inorganic HM 112. A combination of acid ($H^+$) and heat are applied to the attached polymer brush 508 in order to break the bond between the grafting group 314 and the remainder of the polymer brush 508. The residual polymer 504 can then be rinsed away by an organic solvent.

The photolithographic processes involving the polymer brushes 104 disclosed herein can be used in the fabrication of integrated circuit chips for use in electronic devices. These integrated circuit chips can be distributed by the fabricator as raw wafers, bare die, packaged in a single chip form (e.g., a plastic carrier with leads attached to a motherboard or other carrier), packaged in a multichip form (e.g., a ceramic carrier with surface interconnections and/or buried interconnections), etc. The chips can be integrated with other chips, circuit elements, signal processing devices, etc.

Examples of end products that can contain the chip include computing devices (e.g., computer products including a display, keyboard or other input device, and processors), toys, appliances, automotive parts, etc.

In addition to improving the adhesion of a photoresist to an inorganic hardmask 112, silicon wafer 116, or other substrate, the polymer brushes 104 disclosed herein can be used for other purposes. For example, the polymer brushes 104 could be used to improve adhesion between an inorganic surface and a non-photoresist polymer. The polymer brushes 104 could also be used to improve wettability of a surface, prevent biofouling on underwater surfaces, improve the performance of ion beam etching, etc.

It should be noted that, in some embodiments, the compounds described herein can contain one or more chiral centers. These can include racemic mixtures, diastereomers, enantiomers, and mixtures containing one or more stereoisomer. Further, the disclosed compounds can encompass racemic forms of the compounds in addition to individual stereoisomers, as well as mixtures containing any of these. Temperature and time ranges indicated herein can include the temperature or time on either end of the range, or any temperature or time between these limits.

The synthetic processes discussed herein and their accompanying drawings are prophetic examples, and are not limiting; they can vary in reaction conditions, components, methods, etc. In addition, the reaction conditions can optionally be changed over the course of a process. Further, in some embodiments, processes can be added or omitted while still remaining within the scope of the disclosure, as will be understood by a person of ordinary skill in the art.

What is claimed is:

1. A polymer brush, comprising:
   a plurality of repeat units;
   at least one portion of the plurality of repeat units having one or more grafting groups, wherein the one or more grafting groups are selected based on an identity of an inorganic substrate;
   at least one portion of the plurality of repeat units having one or more cleavable groups, wherein the one or more cleavable groups do not bind to the inorganic substrate; and
   at least one portion of the plurality of repeat units having one or more interface tuning groups, wherein the one or more interface tuning groups are selected based on an identity of a photoresist.

2. The polymer brush of claim 1, wherein the one or more grafting groups are independently selected from a group consisting of alkynes, primary hydroxyls, secondary hydroxyls, acrylic acids, epoxies, alkenes, phosphonic acids, propargyls, phosphonic esters, amines, carboxylic acids, and alkoxysilanes.

3. The polymer brush of claim 1, wherein the one or more interface tuning groups are independently selected from a group consisting of an acidic group, a phenyl group, a methoxy group, an ethylene group, a hydrogen atom, a methyl group, and a trifluoromethyl group.

4. The polymer brush of claim 1, wherein the one or more cleavable groups are esters.

5. The polymer brush of claim 1, wherein the one or more interface tuning groups mediate adhesion between the inorganic substrate and the photoresist.

6. The polymer brush of claim 1, wherein the inorganic substrate is an inorganic hardmask.

7. The polymer brush of claim 6, wherein the inorganic hardmask comprises a material selected from a group consisting of silicon, titanium nitride, titanium oxides, titanium oxynitrides, tantalum nitride, hafnium oxides, niobium nitride, lanthanum oxide, silicon oxides, silicon oxynitrides, zirconium oxides, and tin oxides.

8. An electronic device, comprising:
   at least one integrated circuit chip prepared in an extreme ultraviolet lithographic patterning process, wherein the extreme ultraviolet lithographic patterning process comprises:
      providing an inorganic substrate; and
      depositing a polymer brush onto the inorganic substrate, wherein the polymer brush comprises:
         a plurality of repeat units;
         at least one portion of the plurality of repeat units having one or more grafting groups, wherein the one or more grafting groups are selected based on an identity of the inorganic substrate;
         at least one portion of the plurality of repeat units having one or more cleavable groups, wherein the one or more cleavable groups do not bind to the inorganic substrate; and
         at least one portion of the plurality of repeat units having one or more interface tuning groups, wherein the one or more interface tuning groups are selected based on an identity of a photoresist.

9. The electronic device of claim 8, further comprising at least one additional circuit chip.

* * * * *